(12) United States Patent
Li (10) Patent No.: US 9,638,993 B2
(45) Date of Patent: May 2, 2017

(54) PHASE-SHIFT MASK (71) Applicant: BOE TECHNOLOGY GROUP CO., LTD, Beijing (CN)

(72) Inventor: Wusheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 154 days.

(21) Appl. No.: 14/494,627

(22) Filed: Sep. 24, 2014

(65) Prior Publication Data
US 2015/0301443 A1    Oct. 22, 2015

(30) Foreign Application Priority Data

Apr. 22, 2014   (CN) .......................... 2014 1 0163165

(51) Int. Cl.
| | | |
|---|---|---|
| *G03F 1/26* | (2012.01) | |
| *H01L 27/12* | (2006.01) | |
| *G03F 1/36* | (2012.01) | |
| *H01L 29/417* | (2006.01) | |
| *H01L 29/66* | (2006.01) | |

(52) U.S. Cl.
CPC ................ *G03F 1/26* (2013.01); *G03F 1/36* (2013.01); *H01L 27/1288* (2013.01); *H01L 29/41733* (2013.01); *H01L 29/66742* (2013.01)

(58) Field of Classification Search
CPC . G03F 1/26; G03F 1/36; G03F 1/0046; G03F 1/0084; G03F 1/29; H01L 29/41725; H01L 29/41733; H01L 29/66742
See application file for complete search history.

(56) References Cited

U.S. PATENT DOCUMENTS 5,248,575 A    9/1993 Ogoshi
2002/0142597 A1*   10/2002 Park ........................ G03F 1/36
                                                         438/689
(Continued)

FOREIGN PATENT DOCUMENTS

CN   101179082 A   5/2008
CN   103149790 A   6/2013
(Continued)

OTHER PUBLICATIONS

Machine translation of JP 2011-215226 A.*
Office Action dated Aug. 3, 3016 issued in corresponding Chinese Application No. 201410163165.0.

*Primary Examiner* — Jonathan Jelsma
(74) *Attorney, Agent, or Firm* — Nath, Goldberg & Meyer; Joshua B. Goldberg; Scott H. Blackman (57) ABSTRACT

The present invention provides a phase-shift mask comprising a light shading region which is covered by a light shading pattern and a light transmission region which is not covered by the light shading pattern, the light shading pattern comprises a symmetrical part and an asymmetrical part provided outside the symmetrical part, wherein, an optical blocking unit is provided in a part of the light transmission region outside the symmetrical part away from the asymmetrical part, so that intensity of light transmitted through the part of the light transmission region provided with the optical blocking unit is reduced. During an exposure process using the phase-shift mask of the present invention, the obtained exposure intensity is more uniform.

12 Claims, 5 Drawing Sheets

(56) References Cited

U.S. PATENT DOCUMENTS

| | | | |
|---|---|---|---|
| 2008/0073718 A1* | 3/2008 | Lee | H01L 29/41733 257/347 |
| 2008/0296665 A1* | 12/2008 | Peng | G03F 1/144 257/327 |
| 2009/0068571 A1* | 3/2009 | Dong | G03F 1/144 430/5 |
| 2010/0040960 A1* | 2/2010 | Piao | G03F 1/144 430/5 |
| 2011/0053323 A1* | 3/2011 | Jhang | G03F 1/14 438/151 |

FOREIGN PATENT DOCUMENTS

| | | | |
|---|---|---|---|
| CN | 103454851 A | | 12/2013 |
| JP | H6-138646 A | | 5/1994 |
| JP | 2011215226 A | * | 10/2011 |

* cited by examiner

PHASE-SHIFT MASK

FIELD OF THE INVENTION

The present invention relates to the field of semiconductor technology, and particularly, to a phase-shift mask.

BACKGROUND OF THE INVENTION

A mask is also referred to as a photo-mask. Currently, a phase-shift mask is available. The phase-shift mask comprises a substrate, on which a light transmission region and a light shading region are formed while a phase-shift region and a non-phase-shift region are formed. During an exposure process using the phase-shift mask, the phase of the light transmitted through the phase-shift region is changed by 180°, and the phase of the light transmitted through the non-phase-shift remains unchanged, thereby destructive interference occurs between the light transmitted through the phase-shift region and the light transmitted through the non-phase-shift region, and an objective to better control the critical dimension (CD) of a pattern to be formed can be achieved.

Figure 1A:
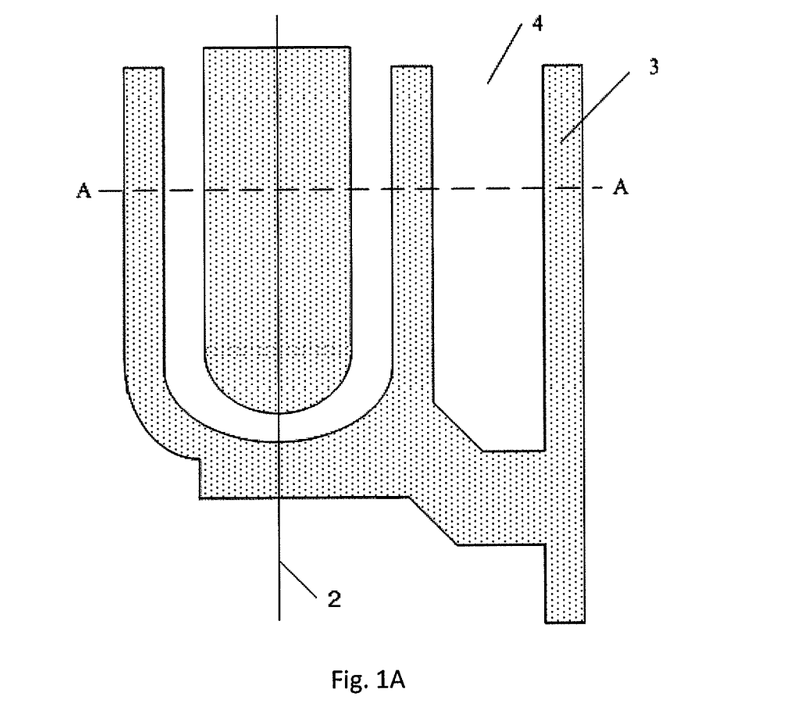
FIG. 1A shows a top view of a phase-shift mask in the prior art.
Figure 1B:
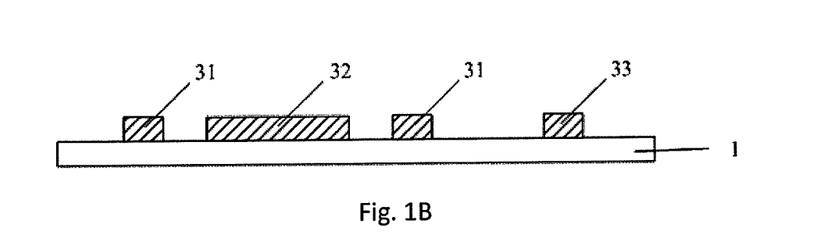
FIG. 1B shows a sectional view of the phase-shift mask shown in FIG. 1A along the line A-A.

FIG. 1A shows a structure of a phase-shift mask usually used for forming a source, a drain and a data line of a thin film transistor (TFT) in the prior art. FIG. 1B shows a sectional view of the phase-shift mask in FIG. 1A along the line A-A. As shown in FIGS. 1A and 1B, the phase-shift mask comprises a substrate 1 and a light shading pattern 3 formed on the substrate 1. The substrate 1 has a relatively stable thermophotovoltaic property, and is usually formed of transparent medium such as quartz or the like. On the substrate 1, a region with no light shading pattern 3 formed thereon is referred to as a light transmission region, and the light shading pattern 3 corresponds to a light shading region. The light shading pattern 3, for example, is formed with a light shading and phase-shift film or comprises a light shading layer and a phase-shift layer, that is, the light shading region corresponds to the phase-shift region and the light transmission region corresponds to the non-phase-shift region. For example, a phase-shift layer with a low light transmittance (about 8%), as the light shading pattern 3, may be formed on the substrate 1 by performing deposition, photolithography, development, etching and stripping of pattern material. The phase-shift layer is usually formed of a material with a low light transmittance and capable of reversing the phase of light (i.e., shifting the phase of light by 180°±10°). When the phase-shift mask is used to form a source, a drain and a data line of a thin film transistor, the phase of the light transmitted through the phase-shift region of the phase-shift mask is reversed (i.e., the phase of the light is shifted by 180°), and the phase of the light transmitted through the non-phase-shift region of the phase-shift mask remains unchanged, thus destructive interference occurs between the light transmitted through the phase-shift region and the light transmitted through the non-phase-shift region, thereby the resolution of the pattern formed by using the phase-shift mask is relatively high.

Figure 1C:
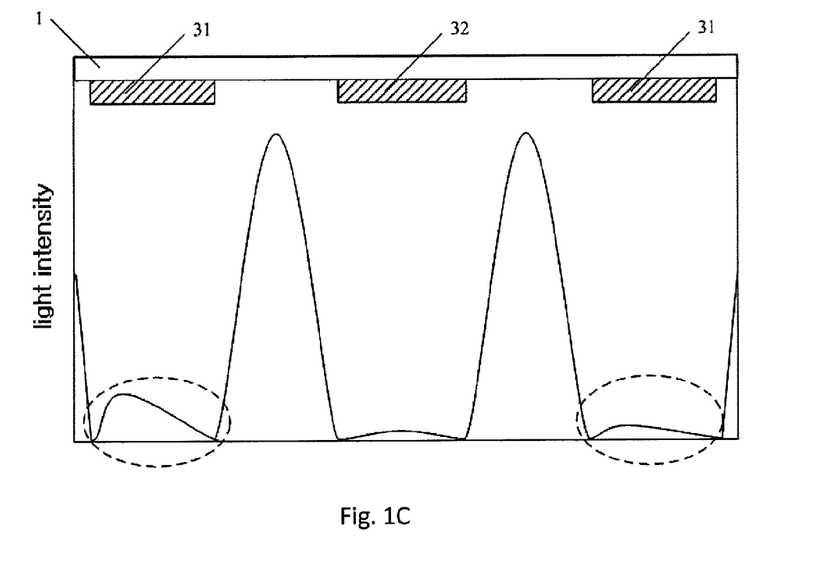
FIG. 1C shows a diagram of exposure intensity during an exposure process using the phase-shift mask shown in FIG. 1A.

One development trend of the panel display technology is to obtain a high resolution. To achieve this objective, the phase-shift mask is regarded as an important technology to increase the resolution and is thus used for manufacturing a thin film transistor. However, from simulation and actual measurement, it can be found that, as an additional pattern is connected to a symmetrical pattern to form the light shading pattern of the phase-shift mask shown in FIG. 1A, during an exposure process using the phase-shift mask, the exposure intensity distribution corresponding to the symmetrical pattern may be asymmetrical, resulting in that a pattern which should be formed to be symmetrical is actually asymmetrical. As shown in FIGS. 1A and 1B, the U-shaped pattern of the phase-shift mask is used for forming a source of a thin film transistor and is referred to as a source pattern 31, and the stick-shaped pattern inserted into the recessed part of the U-shaped pattern is used for forming a drain of the thin film transistor and is referred to as a drain pattern 32. The U-shaped pattern and the stick-shaped pattern constitutes the symmetrical pattern, and an additional pattern used for forming a data line of the thin film transistor is connected to the right side of the U-shaped pattern, and the additional pattern is referred to as a data line pattern 33 and is connected with the source pattern 31. Due to the connection of the additional pattern, during an exposure process using the phase-shift mask, the exposure intensity distribution corresponding to the symmetrical pattern (in particular, the source pattern 31) may be influenced to be asymmetrical. FIG. 1C shows a diagram of the exposure intensity distribution corresponding to the symmetrical pattern during an exposure process using the phase-shift mask shown in FIG. 1A. As indicated by the dotted line in the FIG. 1C, the light transmittance intensity at the side of the source pattern 31 connected with the data line pattern 33 is relatively weak, and the light transmittance intensity at the other side of the source pattern 31 with no data line pattern 33 connected thereto is relatively strong. Therefore, when using the above phase-shift mask to form a source, a drain and a data line of a thin film transistor, the thin film transistor may have poor performance due to the asymmetry of the formed source. For example, the ratio between the width and the length of the channel of the TFT (i.e., the width of the channel/the length of the channel, W/L) may be changed so that the turned-on current $I_{on}$ of the TFT is reduced, thereby the display quality of a display panel comprising the thin film transistor may be affected.

SUMMARY OF THE INVENTION

In view of the above defect in the prior art, the technical problem to be solved by the present invention is to provide a phase-shift mask so that, during an exposure process using the phase-shift mask, the exposure intensity distribution is more uniform, thereby the probability that a semiconductor device manufactured by using the phase-shift mask is defective is reduced.

A technical solution employed to solve the technical problem is a phase-shift mask comprising a light shading region which is covered by a light shading pattern and a light transmission region which is not covered by the light shading pattern, wherein the light shading pattern comprises a symmetrical part and an asymmetrical part provided outside the symmetrical part, wherein, an optical blocking unit is provided in a part of the light transmission region outside the symmetrical part away from the asymmetrical part, so that intensity of light transmitted through the part of the light transmission region provided with the optical blocking unit is reduced.

A projection of the optical blocking unit on a symmetrical axis of the symmetrical part may at least cover an overlap of projections of the symmetrical part and the asymmetrical part on the symmetrical axis.

The optical blocking unit may also be provided in a part of the light transmission region where light transmittance intensity is larger than a desired value.

The optical blocking unit may be a light shading strip, which is close to the light shading pattern, and a gap is formed between the light shading strip and the light shading pattern.

The light shading strip may be formed with an inorganic film, and the inorganic film includes a chrome film.

The light shading strip may have a light transmittance smaller than or equal to 5%.

The light shading pattern may comprise a strip-shaped pattern, and a width of the light shading strip may be ⅛ to ¼ of a minimum width of the strip-shaped pattern.

The width of the light shading strip may range from 0.3 μm to 0.7 μm, and a width of the gap may range from 0.3 μm to 0.5 μm.

The phase-shift mask may comprise a transparent substrate, the light shading pattern may be formed with a phase-shift film on the substrate to form the light shading region, and the light shading strip is formed in the same layer as the light shading pattern on the substrate.

The light shading pattern may comprise a phase-shift layer and a light shading layer, and the light shading strip may also comprise a phase-shift layer and a light shading layer, wherein the phase-shift layer and the light shading layer of the light shading strip are formed in the same layers as the phase-shift layer and the light shading layer of the light shading pattern, respectively.

The phase-shift mask may be used for forming a source, a drain and a data line of a thin film transistor, wherein the symmetrical part comprises a source pattern for forming the source and a drain pattern for forming the drain, and the asymmetrical part comprises a data line pattern for forming the data line and a connection part pattern for forming a connection part between the data line and the source.

The optical blocking unit may also be provided in a part of the light transmission region outside the connection part pattern away from the data line pattern.

The source pattern may be a U-shaped pattern, and drain pattern may be a stick-shaped pattern inserted into a recessed part of the U-shaped pattern.

The optical blocking unit may be provided outside the U-shaped pattern except the side provided with the data line pattern.

Advantageous Effect of the Present Invention

In the phase-shift mask of the present invention, the optical blocking unit is added in the part of the light transmission region outside the symmetrical part away from the asymmetrical, thus the light transmittance at the side of the light shading pattern with no asymmetrical part connected thereto is reduced, thereby the intensity distribution of the light transmitted through the phase-shift mask is more uniform, and the probability that a pattern formed through an exposure process using the phase-shift mask is defective is reduced.

Correspondingly, when a source, a drain and a data line of a thin film transistor are formed by using the phase-shift mask, the influence on the light transmittance intensity due to the connection of the data line pattern is reduced, thus the probability that the U-shaped source formed by using the phase-shift mask is defective (for example, the edge of the U-shaped source at the side with no data line connected thereto may be over etched so that the U-shaped source is asymmetrical) is reduced, and the phase-shift mask is particularly suitable for manufacturing a display product with a high resolution so as to improve the display quality of the display product.

DETAILED DESCRIPTION OF EMBODIMENTS

In order to make those skilled in the art better understand the technical solutions of the present invention, the present invention will be described in detail below with reference to the drawings and specific embodiments.

A phase-shift mask comprises a light shading region which is covered by a light shading pattern and a light transmission region which is not covered by the light shading pattern, the light shading pattern comprises a symmetrical part and an asymmetrical part provided outside the symmetrical part, wherein, an optical blocking unit is provided in a part of the light transmission region outside the symmetrical part away from the asymmetrical part, so that intensity of light transmitted through the part of the light transmission region provided with the optical blocking unit is reduced. During an exposure process using the phase-shift mask, the exposure intensity distribution is more uniform, thereby the probability that the semiconductor device manufactured by using the phase-shift mask is defective is reduced.

Embodiment 1

Figure 2A:
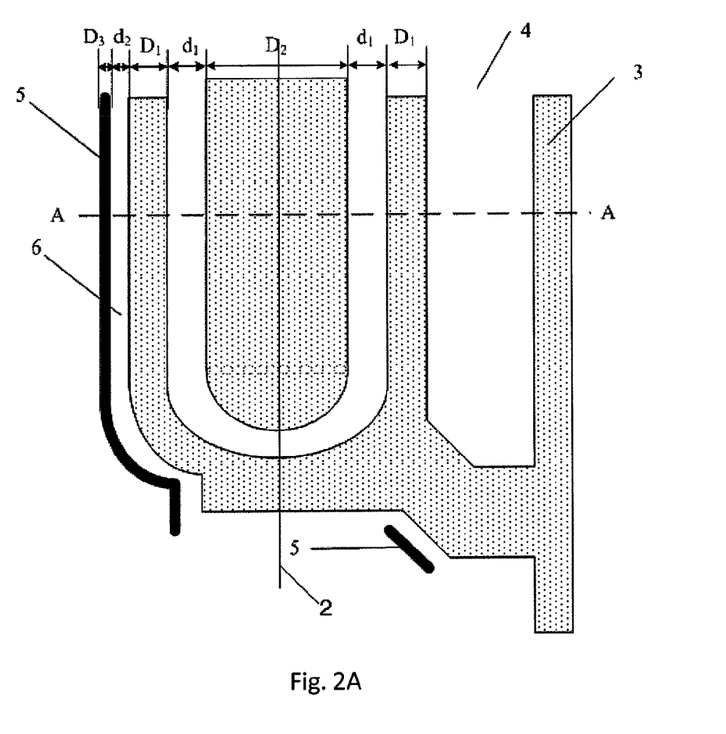
FIG. 2A shows a top view of a phase-shift mask according to embodiment 1 of the present invention.
Figure 2B:
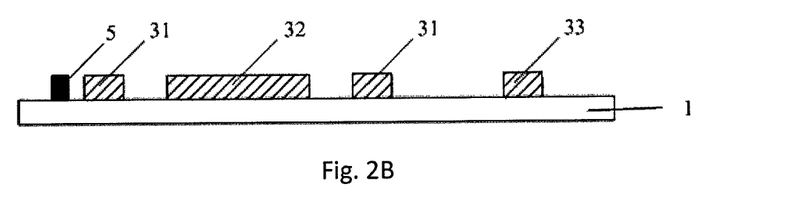
FIG. 2B shows a sectional view of the phase-shift mask shown in FIG. 2A along the line A-A.

The present embodiment provides a phase-shift mask for forming a source, a drain and a data line of a thin film transistor. As shown in FIGS. 2A and 2B, the phase-shift mask comprises a light shading region 3 which is covered by a light shading pattern and a light transmission region 4 which is not covered by the light shading pattern, and the light shading pattern comprises a symmetrical part and an asymmetrical part. Specifically, the symmetrical part is formed with a source pattern (a U-shaped pattern) 31 for forming a source of a thin film transistor and a drain pattern (a stick-shaped pattern inserted into a recessed part of the U-shaped pattern) 32 for forming a drain of the thin film transistor, and the asymmetrical part is formed with a data line pattern 33 for forming a data line of the thin film transistor and a connection part pattern for forming a connection part between the source and the data line of the thin film transistor. Further, in order to avoid the case that the edge of the source at the side with no data line connected thereto is over etched so that the U-shaped source manufactured by using the phase-shift mask is asymmetrical, the phase-shift mask further comprises an optical blocking unit provided in a part of the light transmission region 4 outside the source pattern 31 away from the data line pattern 33. The projection of the optical blocking unit on the symmetrical axis 2 of the symmetrical part at least covers the overlap of the projections of the symmetrical part and the asymmetrical part on the symmetrical axis 2. In the present embodiment, the projection of the optical blocking unit on the symmetrical axis 2 of the source pattern 31 covers and is slightly larger than the projection of the source pattern 31 on the symmetrical axis 2.

In addition, in order to avoid the case that the edge of the connection part at the side with no data line connected thereto is over etched so that the source and the data line cannot be connected with each other, the phase-shift mask further comprises an optical blocking unit provided in a part of the light transmission region 4 outside the connection part pattern away from the data line pattern 33.

Here, the optical blocking unit is provided so that the intensity of the light transmitted through the part of the light transmission region 4 provided with the optical blocking unit is reduced.

Specifically, the optical blocking unit may be a light shading strip 5, which is close to the light shading pattern, and a gap 6 is formed between the light shading strip 5 and the light shading pattern.

The light shading strip 5 may be formed with an inorganic film, and the inorganic film includes a chrome film. Usually, the chrome film has a low light transmittance. In order to achieve a better light shading effect, the light shading strip 5 may have a light transmittance smaller than or equal to 5%.

For example, the phase-shift mask may comprise strip-shaped light shading pattern, in this case, the width of the light shading strip 5 may be ⅛ to ¼ of the minimum width of the strip-shaped light shading pattern. The width of the light shading strip 5 may range from 0.3 µm to 0.7 µm, and the width of the gap 6 may range from 0.3 µm to 0.5 µm.

As shown in FIG. 2A, a light shading strip 5 is provided at the side of the source pattern 31 away from the data line pattern 33, and a light shading strip 5 is provided at the side of the connection part pattern away from the data line pattern 33. According to simulation and actual measurement, the light transmittance intensity at the bottom side of the U-shaped pattern (the source pattern 31) is influenced little by the connection of the data line pattern 33 and the connection part pattern. Thus, in the present embodiment, as shown in FIG. 2A, the light shading strip 5 is not provided at the bottom side of the U-shaped pattern.

In fact, the light shading strip 5 may be provided in any part of the light transmission region 4 where the light transmittance intensity is larger than a desired value, and the light shading strip 5 is close to the light shading pattern. It should be understood that, the desired value refers to a satisfactory light transmittance intensity and may be changed in accordance with requirements.

In the present embodiment, the minimum width of the drain pattern 32 is $D_2$, the minimum width of the source pattern 31 is $D_1$, the width of the gap between the drain pattern 32 and the source pattern 31 is $d_1$, the width of the light shading strip 5 is D3, and the width of the gap 6 between the light shading strip 5 and the light shading pattern is $d_2$.

Usually, the minimum width $D_1$ of the source pattern 31 is smaller than the minimum width $D_2$ of the drain pattern 32 (i.e., $D_1<D_2$), the width $d_2$ of the gap 6 between the light shading strip 5 and the light shading pattern is smaller than the width $d_1$ of the gap between the drain pattern 32 and the source pattern 31 (i.e., $d_2<d_1$).

Here, the minimum width $D_1$ of the source pattern 31 may be not smaller than the photolithography resolution (for example, 3 µm) of a photolithography apparatus using the phase-shift mask, the width $D_3$ of the light shading strip 5 may be smaller than the photolithography resolution (for example, 3 µm) of the photolithography apparatus, and the width $d_2$ of the gap 6 may be also smaller than the photolithography resolution (for example, 3 µm) of the photolithography apparatus. For example, the width $D_3$ of the light shading strip 5 may be ⅛ to ¼ of the minimum width $D_1$ of the source pattern 31, and in this case, the obtained light transmittance intensity may be relatively uniform. The smaller the width of the light shading strip 5 is, the worse the effect of reducing light intensity is. However, on the other hand, if the width of the light shading strip 5 is too large, besides the main pattern to be formed, an undesired pattern may also be formed during an exposure process using the phase-shift mask, and thus influencing the actually formed pattern. The photolithography resolution refers to the minimum line width (or space) which can be resolved during a photolithography. The photolithography resolution of a photolithography apparatus is usually fixed when the apparatus is assembled. Thus, during a production process with the photolithography apparatus, the photolithography resolution maintains unchanged. For example, the photolithography resolution of the photolithography apparatus MPA-7800 is 4 µm.

In the phase-shift mask of the present embodiment, the light shading pattern is formed on the substrate 1 with a light shading and phase-shift film to form the light shading region, wherein the substrate 1 has a relatively stable thermophotovoltaic property, and is usually formed of transparent medium such as quartz or the like. The light shading pattern is usually formed of material with a low light transmittance and capable of reversing the phase of light, such as MoSiON or the like. Meanwhile, in order to simplify the manufacturing process of the phase-shift mask, the light shading strip 5 may be formed in the same layer as the light shading pattern. For example, the phase-shift mask comprises the substrate 1, the light shading pattern which is formed with the light shading and phase-shift film on the substrate 1 and the light shading strip 5 which is formed with an inorganic film in the same layer as the light shading pattern on the substrate 1.

During manufacturing of the phase-shift mask shown in FIGS. 2A and 2B, the light shading pattern, which comprises the source pattern 31, the drain pattern 32 and the data line pattern 33, is first formed on the substrate 1 with a light shading and phase-shift film through a patterning process, and then, the light shading strip 5 is formed on the substrate 1 with an inorganic film (for example, chrome (Cr) film) through a patterning process. The source pattern 31, the drain pattern 32, the data line pattern 33 and the light shading strip 5 are provided in the same layer on the substrate 1.

Correspondingly, when the above phase-shift mask is used to form a source, a drain and a data line of a thin film transistor, the photoresist for shading the material film layer used for forming the source, the drain and the data line may be positive photoresist. During an exposure process, a part of the positive photoresist corresponding to the light transmission region of the phase-shift mask is irradiated by light so that a photochemical reaction occurs, thereby the part of the positive photoresist corresponding to the light transmission region will be dissolved in the developing solution and be removed in the subsequent developing process, and the material film layer shaded by the part of the positive photoresist will be exposed, while the other part of the positive photoresist corresponding to the light shading region is not irradiated by light and is therefore reserved, so that the material film layer in the corresponding region is shaded continuously. At this time, the positive photoresist is formed to have a same pattern as the light shading pattern of the phase-shift mask. During an etching process, the material film layer which is not covered by the positive photoresist, is removed by etching, thereby the source, the drain and the data line of the thin film transistor are formed in the material film layer.

Figure 2C:
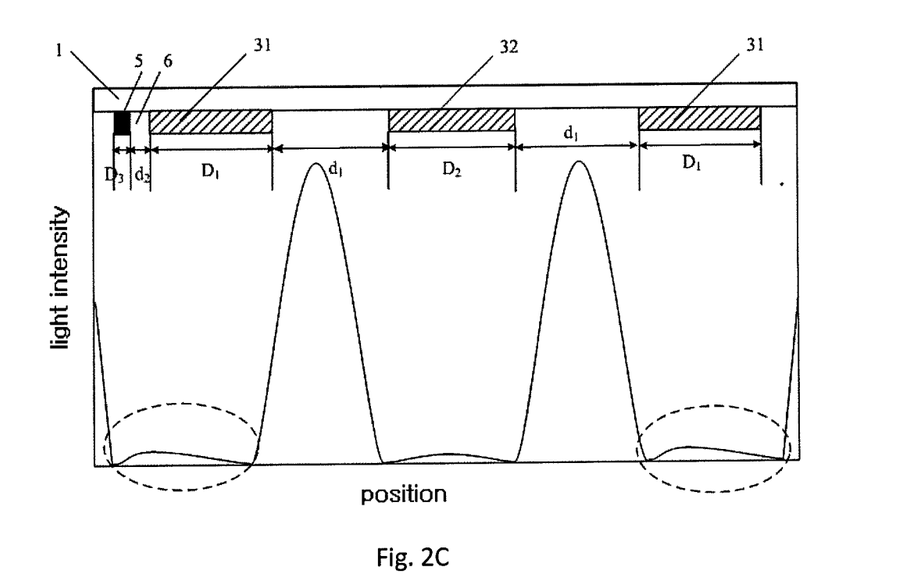
FIG. 2C shows a diagram of exposure intensity during an exposure process using the phase-shift mask shown in FIG. 2A.

During an exposure process using the phase-shift mask of the present embodiment, as shown in FIG. 2C, when the data line pattern is connected to the U-shaped source pattern of the phase-shift mask, the light transmittance intensity of the U-shaped source pattern of the phase-shift mask is influenced little and is still symmetrical substantially. Thus, when a source, a drain and a data line of a thin film transistor are formed by using the phase-shift mask of the present embodiment, compared to those formed by using a phase-shift mask of the prior art, the probability that the U-shaped source is asymmetrical is reduced.

Embodiment 2

Figure 3A:
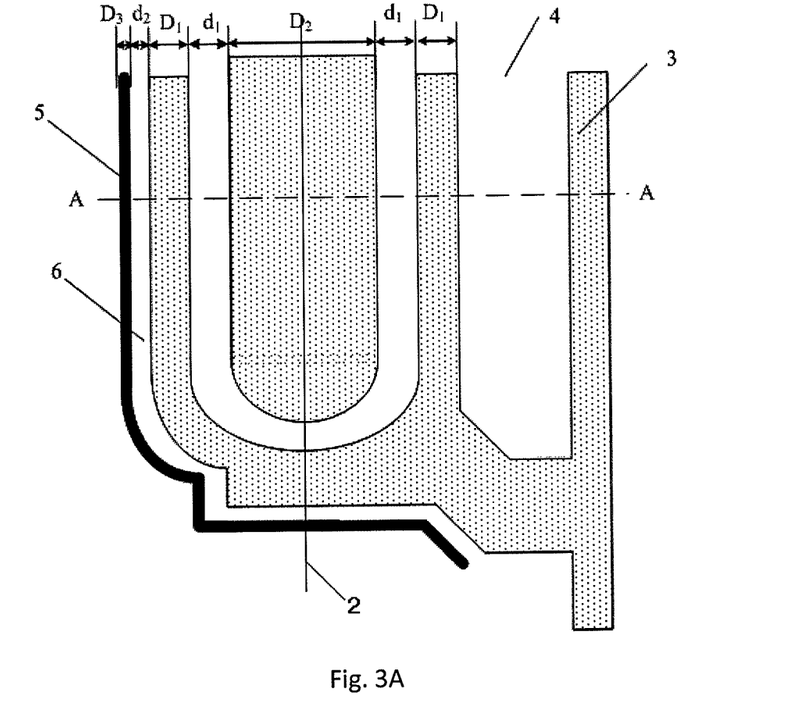
FIG. 3A shows a top view of a phase-shift mask according to embodiment 2 of the present invention.
Figure 3B:
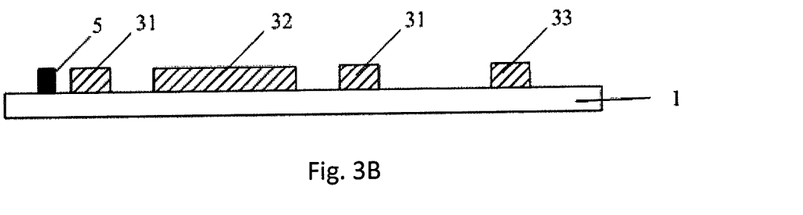
FIG. 3B shows a sectional view of the phase-shift mask shown in FIG. 3A along the line A-A.

The present embodiment provides a phase-shift mask, which differs from the phase-shift mask in Embodiment 1 in that the phase-shift mask of the present embodiment also comprises a light shading strip 5 provided at the bottom side of the U-shaped source pattern 31.

As shown in FIGS. 3A and 3B, in the phase-shift mask of the present embodiment, a light shading strip provided at the side of the source pattern 31 away from the data line pattern 33, a light shading strip provided at the side of the connection part pattern away from the data line pattern 33 and a light shading strip provided at the bottom side of the U-shaped source pattern 31 are connected with each other to form a continuous light shading strip 5. The projection of the continuous light shading strip 5 on the symmetrical axis 2 of the source pattern 31 at least covers the overlap of the projection of the data line pattern 33 on the symmetrical axis 2 and the projections of the U-shaped source pattern 31 and the connection part pattern on the symmetrical axis 2, and there is a gap 6 formed between the light shading strip 5 and the light shading pattern.

Other structures and parameters of the phase-shift mask of the present embodiment are the same as those in Embodiment 1, which will not be repeated here.

During an exposure process using the phase-shift mask of the present embodiment, the obtained exposure intensity distribution is more uniform, thereby the probability that the edge of the source of the thin film transistor formed by using the phase-shift mask is over etched is reduced.

Embodiment 3

Figure 4:
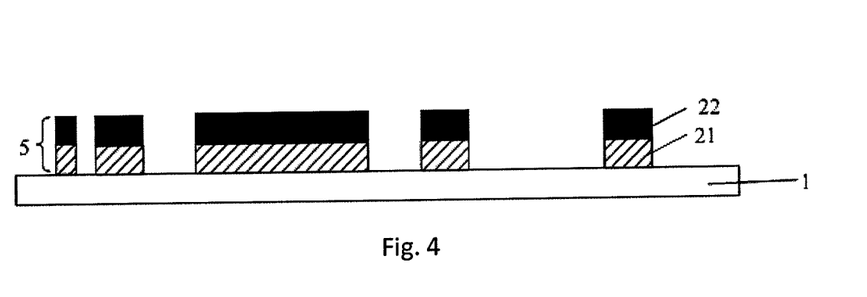
FIG. 4 shows a sectional view of a phase-shift mask according to embodiment 3 of the present invention.

The differences between the present embodiment and Embodiment 1 or 2 are as follows. As shown in FIG. 4, the light shading pattern of the phase-shift mask of the present embodiment comprises a phase-shift layer 21 formed on a transparent substrate 1 and a light shading layer 22 formed on the phase-shift layer 21. The light shading strip 5 also comprises a phase-shift layer 21 and a light shading layer 22, and the phase-shift layer 21 and the light shading layer 22 of the light shading strip 5 are formed in the same layers as the phase-shift layer 21 and the light shading layer 22 of the light shading pattern, respectively. The phase-shift layer 21 is used for reversing the phase of the light transmitted therethrough, and the light shading layer 22 is used for light shading.

Figure 5A:
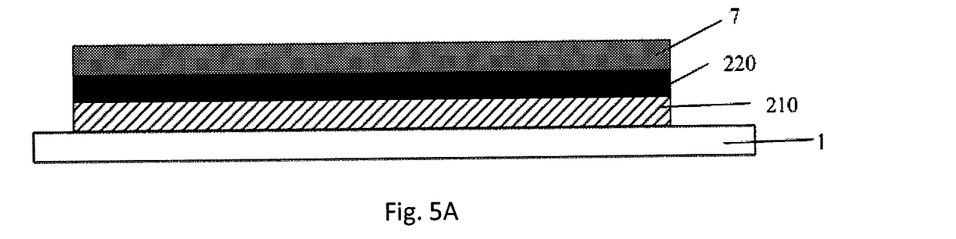
FIGS. 5A to 5C shows manufacturing steps of the phase-shift mask shown in FIG. 4.
Figure 5B:
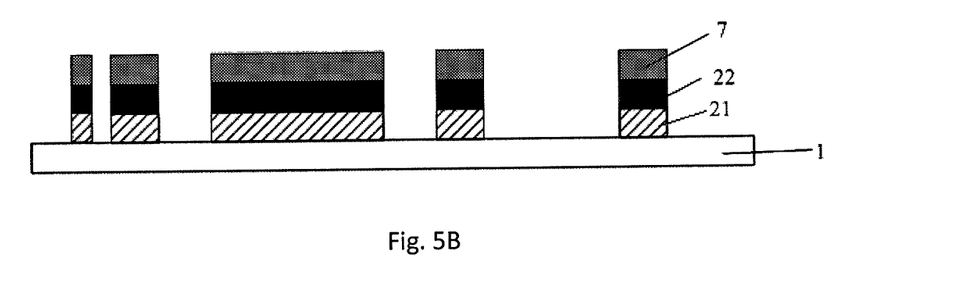
Figure 5C:
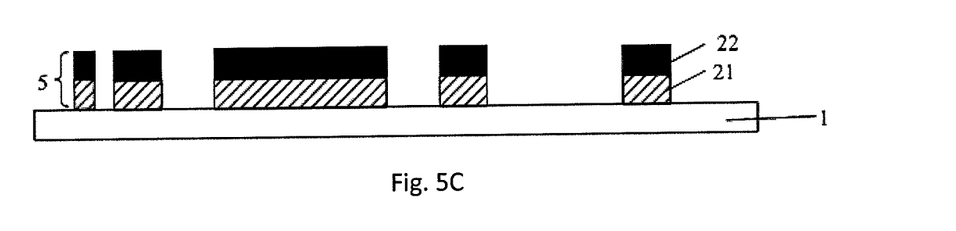

FIGS. 5A to 5C show the manufacturing steps of the phase-shift mask of the present embodiment. As shown in FIG. 5A, first, a phase-shift film 210, an inorganic film (for example, chrome film) 220 for light shading and a positive photoresist layer 7 are subsequently formed on the substrate 1. Then, by exposing, developing and dry etching, the pattern as shown in FIG. 5B is obtained. For example, a dry etching with a highly directive property (that is, the etch rate in one direction is higher than that in other directions) may be used, so that the dimensions of the etched portions of the phase-shift film 210 and the inorganic film 220 are substantially the same as that of the exposed portion of the positive photoresist 7, thereby the phase-shift layer 21 (comprising the phase-shift layers of the light shading pattern and the light shading strip) and the light shading layer 22 (comprising the light shading layers of the light shading pattern and the light shading strip) are formed. Finally, a portion of the photoresist 7 on the light shading layer 22 is stripped off, and the phase-shift mask as shown in FIG. 5C is manufactured. With the above manufacturing process, the width $d_2$ of the gap 6 is a predetermined value, and there is no misalignment between the two layers of the light shading strip 5.

In the present embodiment, the stacking sequence of the phase-shift layer 21 and the light shading layer 22 on the substrate 1 may be changed, that is, the light shading layer 22 may be formed on the substrate 1, and the phase-shift layer 21 is formed on the light shading layer 22, which is not limited by the present invention.

Although the above embodiments only illustrate the examples in which the phase-shift region overlaps with the light shading region of the phase-shift mask, however, it should be understood that, the phase-shift region may be provided in the light transmission region of the phase-shift mask, the location of the phase-shift region in the phase-shift mask may be determined by those skilled in the art in accordance with requirements, that is, the phase-shift layer and the light shading layer may be provided separately, which is not limited by the present invention.

In addition, it should be understood by those skilled in the art that, the symmetrical part herein refers to a relatively symmetrical part, which may be not absolutely symmetrical.

In the phase-shift mask of the present invention, the optical blocking unit is added in a part of the light transmission region outside the symmetrical part away from the asymmetrical, thus the light transmittance at the side of the light shading pattern with no asymmetrical part connected thereto is reduced, thereby the intensity distribution of the light transmitted through the phase-shift mask is more uniform, and the probability that a pattern formed through an exposure process using the phase-shift mask is defective is reduced.

Correspondingly, when a source, a drain and a data line of a thin film transistor are formed by using the phase-shift mask, the influence on the light transmittance intensity due to the connection of the data line pattern is reduced, thus the probability that the U-shaped source formed by using the phase-shift mask is defective (for example, the edge of the U-shaped source at the side with no data line connected thereto may be over etched so that the U-shaped source is asymmetrical) is reduced, and the phase-shift mask is particularly suitable for manufacturing a display product with a high resolution so as to improve the display quality of the display product.

It should be understood that, the above implementations are only used to explain the principle of the present invention, but not to limit the present invention. The person skilled in the art can make various variations and modifications without departing from the spirit and scope of the present invention, and therefore, these variations and modifications are also considered to be within the protection scope of the present invention.

The invention claimed is:

1. A phase-shift mask used for forming a source, a drain and a data line of a thin film transistor, comprising a light shading region which is covered by a light shading pattern and a light transmission region which is not covered by the light shading pattern, the light shading pattern comprises a symmetrical part and an asymmetrical part provided on an outside portion of the symmetrical part, wherein the symmetrical part is symmetrical about a symmetrical axis and the symmetrical part comprises a source pattern for forming the source and a drain pattern for forming the drain, and the asymmetrical part is asymmetrical about the symmetrical axis and the asymmetrical part comprises a data line pattern for forming the data line and a connection part pattern for forming a connection part between the data line and the source, wherein the source pattern is a U-shaped pattern, and the drain pattern is a stick-shaped pattern inserted into a recessed part of the U-shaped pattern, and wherein, an optical blocking unit that is asymmetrical about the light shading pattern is provided in the light transmission region on another outside portion of the symmetrical part away from the asymmetrical part, so that intensity of light transmitted through the part of the light transmission region provided with the optical blocking unit is reduced.

2. The phase-shift mask of claim 1, wherein a projection of the optical blocking unit on a symmetrical axis of the symmetrical part at least covers an overlap of projections of the symmetrical part and the asymmetrical part on the symmetrical axis.

3. The phase-shift mask of claim 1, wherein the optical blocking unit is also provided in a part of the light transmission region where light transmittance intensity is larger than a desired value.

4. The phase-shift mask of claim 1, wherein the optical blocking unit is a light shading strip, which is close to the light shading pattern, and a gap is formed between the light shading strip and the light shading pattern.

5. The phase-shift mask of claim 4, wherein the light shading strip is formed with an inorganic film, and the inorganic film includes chrome film.

6. The phase-shift mask of claim 4, wherein the light shading strip has a light transmittance smaller than or equal to 5% for a lithography light with a certain wavelength.

7. The phase-shift mask of claim 4, wherein the light shading pattern comprises a strip-shaped pattern, and a width of the light shading strip is ⅛ to ¼ of a minimum width of the strip-shaped pattern.

8. The phase-shift mask of claim 7, wherein the width of the light shading strip ranges from 0.3 μm to 0.7 μm, and a width of the gap ranges from 0.3 μm to 0.5 μm.

9. The phase-shift mask of claim 4, further comprising a transparent substrate, wherein the light shading pattern is formed on the substrate by using a phase-shift film to form the light shading region, and the light shading strip is formed in the same layer as the light shading pattern on the substrate.

10. The phase-shift mask of claim 9, wherein the light shading pattern comprises a phase-shift layer and a light shading layer, and the light shading strip also comprises a phase-shift layer and a light shading layer, the phase-shift layer and the light shading layer of the light shading strip are formed in the same layers as the phase-shift layer and the light shading layer of the light shading pattern, respectively.

11. The phase-shift mask of claim 1, wherein the optical blocking unit is also provided in a part of the light transmission region outside the connection part pattern away from the data line pattern.

12. The phase-shift mask of claim 1, wherein the optical blocking unit is provided outside the U-shaped pattern except the side provided with the data line pattern.

* * * * *